(12) United States Patent
Soer et al.

(10) Patent No.: US 11,075,327 B2
(45) Date of Patent: Jul. 27, 2021

(54) HYBRID CHIP-ON-BOARD LED MODULE WITH PATTERNED ENCAPSULATION

(71) Applicant: LUMILEDS LLC, San Jose, CA (US)

(72) Inventors: Wouter Anthon Soer, Palo Alto, CA (US); Rene Helbing, Palo Alto, CA (US); Guan Huang, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/690,837

(22) Filed: Nov. 21, 2019

(65) Prior Publication Data
US 2020/0127176 A1 Apr. 23, 2020

Related U.S. Application Data

(63) Continuation of application No. 15/887,603, filed on Feb. 2, 2018, now Pat. No. 10,490,710, which is a
(Continued)

(51) Int. Cl.
*H01L 33/50* (2010.01)
*H05B 47/10* (2020.01)
(Continued)

(52) U.S. Cl.
CPC ........ *H01L 33/508* (2013.01); *H01L 25/0753* (2013.01); *H01L 33/54* (2013.01);
(Continued)

(58) Field of Classification Search
CPC ....... H01L 33/50; H01L 33/502; H01L 27/00; H01L 33/504; H01L 33/508; H01L 33/52;
(Continued)

(56) References Cited

U.S. PATENT DOCUMENTS

| 6,773,139 B2 | 8/2004 | Sommers |
| 7,344,952 B2 | 3/2008 | Chandra |

(Continued)

FOREIGN PATENT DOCUMENTS

| CN | 101313405 A | 11/2008 |
| CN | 102192424 A | 9/2011 |

(Continued)

OTHER PUBLICATIONS

EPO as ISA, International Search Report and Written Opinion dated Jan. 5, 2015 from International Application No. PCT/1814/64070, filed Aug. 26, 2014, 13 pages.

*Primary Examiner* — Jason Crawford

(57) ABSTRACT

Light modules and methods of forming light modules are disclosed. A light module includes a first plurality and a second plurality of light emitting elements configured to emit, respectively, a first light and a second light, and both arranged on a substrate. An encapsulation layer is disposed over the first and second plurality of the light emitting elements, and a wavelength converting element is dispersed in the encapsulation layer. A concentration of the wavelength converting element in the encapsulation layer varies, is larger over the first plurality of light emitting elements and is smaller over the second plurality of light emitting elements.

15 Claims, 2 Drawing Sheets

Related U.S. Application Data continuation of application No. 15/106,667, filed as application No. PCT/IB2014/064070 on Aug. 26, 2014, now Pat. No. 9,905,737.

(60) Provisional application No. 61/929,530, filed on Jan. 21, 2014.

(51) Int. Cl.
*H01L 33/52* (2010.01)
*H01L 33/54* (2010.01)
*H01L 25/075* (2006.01)
*H05B 45/10* (2020.01)

(52) U.S. Cl.
CPC .............. *H05B 45/10* (2020.01); *H05B 47/10* (2020.01); *H01L 33/50* (2013.01); *H01L 33/502* (2013.01); *H01L 33/52* (2013.01); *H01L 2924/0002* (2013.01); *H01L 2933/005* (2013.01); *H01L 2933/0041* (2013.01); *H01L 2933/0091* (2013.01)

(58) Field of Classification Search
CPC ...... H01L 2933/0041; H01L 2933/005; H05B 45/10; H05B 45/20; H05B 47/10; H05B 47/155; H05B 33/14; H05B 33/145; H05B 33/20
See application file for complete search history.

(56) References Cited

U.S. PATENT DOCUMENTS

| | | | |
|---|---|---|---|
| 7,777,412 B2* | 8/2010 | Pang | H01L 33/505 |
| | | | 313/501 |
| 8,294,162 B2* | 10/2012 | Nakajima | H01L 25/0753 |
| | | | 257/88 |
| 8,436,549 B2 | 5/2013 | Hasnain | |
| 8,899,789 B2 | 12/2014 | Chung et al. | |
| 9,006,006 B2 | 4/2015 | Konishi | |
| 9,905,737 B2* | 2/2018 | Soer | H01L 25/0753 |
| 10,490,710 B2* | 11/2019 | Soer | H01L 33/54 |
| 2005/0202598 A1* | 9/2005 | Suehiro | H01L 24/97 |
| | | | 438/118 |
| 2009/0179213 A1* | 7/2009 | Cannon | H01L 33/507 |
| | | | 257/98 |
| 2010/0320486 A1 | 12/2010 | Helbing et al. | |
| 2011/0001151 A1* | 1/2011 | Le Toquin | H01L 33/44 |
| | | | 257/98 |
| 2011/0089810 A1* | 4/2011 | Su | H01L 25/0753 |
| | | | 313/483 |
| 2011/0316006 A1* | 12/2011 | Xu | H01L 25/0753 |
| | | | 257/88 |
| 2012/0119640 A1 | 5/2012 | Nishioka | |
| 2012/0155076 A1 | 6/2012 | Li et al. | |
| 2012/0300452 A1* | 11/2012 | Harbers | F21V 7/30 |
| | | | 362/231 |
| 2013/0020929 A1* | 1/2013 | van de Ven | H05B 45/20 |
| | | | 313/498 |
| 2013/0258653 A1 | 10/2013 | Hsieh et al. | |
| 2013/0265757 A1 | 10/2013 | Tanaka | |
| 2014/0111985 A1* | 4/2014 | Harbers | F21V 13/14 |
| | | | 362/231 |
| 2014/0203729 A1 | 7/2014 | Van De Ven | |
| 2014/0217433 A1* | 8/2014 | Tudorica | H01L 25/0753 |
| | | | 257/89 |
| 2015/0024516 A1* | 1/2015 | Seibel, II | H01L 33/0095 |
| | | | 438/7 |
| 2015/0140700 A1* | 5/2015 | Sato | H01L 33/502 |
| | | | 438/27 |
| 2016/0118554 A1 | 4/2016 | Akram et al. | |

FOREIGN PATENT DOCUMENTS

| | | |
|---|---|---|
| CN | 103367345 A | 10/2013 |
| EP | 2365525 A2 | 9/2011 |
| JP | 2005-005482 A | 1/2005 |
| JP | 2009-231027 A | 10/2009 |
| JP | 3168550 U | 6/2011 |
| JP | 2011-138831 A | 7/2011 |
| JP | 2012-142430 A | 7/2012 |
| JP | 2013-051375 A | 3/2013 |
| JP | 2015082550 A | 4/2015 |
| KR | 10-1168318 B1 | 7/2012 |
| TW | 201036198 A | 10/2010 |
| TW | 201225741 A | 6/2012 |
| WO | 2007/060595 A2 | 5/2007 |

* cited by examiner

HYBRID CHIP-ON-BOARD LED MODULE WITH PATTERNED ENCAPSULATION

CROSS-REFERENCE TO RELATED APPLICATIONS

The present application is a continuation of U.S. patent application Ser. No. 15/887,603, filed Feb. 2, 2018, titled "HYBRID CHIP-ON-BOARD LED MODULE WITH PATTERNED ENCAPSULATION", which issued as U.S. Pat. No. 9,905,737 on Feb. 27, 2018, which is a continuation of U.S. patent application Ser. No. 15/106,667, filed Jun. 20, 2016, titled "HYBRID CHIP-ON-BOARD LED MODULE WITH PATTERNED ENCAPSULATION", which is a § 371 application of International Application No. PCT/IB2014/064070 filed on Aug. 26, 2014 and entitled "HYBRID CHIP-ON-BOARD LED MODULE WITH PATTERNED ENCAPSULATION", which claims priority to U.S. Provisional Patent Application No. 61/929,530 filed Jan. 21, 2014. U.S. patent application Ser. Nos. 15/887,603 and 15/106,667, International Application No. PCT/IB2014/064070, and U.S. Provisional Patent Application No. 61/929,530 are incorporated herein.

This invention was made with U.S. Government support under Contract No. DE-EE0005099 awarded by the Department of Energy (DOE). The Government has certain rights in this invention.

FIELD OF THE INVENTION

This invention relates to the field of light emitting elements, and in particular to a hybrid (multiple light emitting elements of different colors) LED module that includes a patterned encapsulation that provides different wavelength conversion elements for different colors.

BACKGROUND OF THE INVENTION

With the increased demand for high-output semiconductor light emitting devices (LEDs), modules comprising an array of light emitting elements are often used. The individual light emitting elements may be "mid-power", consuming less than a half watt, and dozens may be contained in the array, providing relatively high light output intensity.

To produce a desired color, such as white light, light of different wavelengths are combined. In some embodiments, the array of light emitting elements may include sets of light emitting elements of different color, such as red, blue, and green/yellow. The intensity of the light output of each color will define the color of the composite light output from the array.

In other embodiments, the array of light emitting elements may all emit light of the same wavelength, and wavelength conversion material may be used to convert at least a portion of the light emitted by the light emitting elements to different wavelengths, such that the light output is a combination of the originally emitted light and the wavelength converted light. This wavelength conversion material is commonly contained in the encapsulant that covers the array.

"Chip-on-Board" (COB) is an array architecture that is commonly used because of its flexibility and low cost. A COB may comprise an array of light emitting elements arranged on a substrate and covered by an encapsulant within a ring or dam surrounding the light emitting elements. The encapsulant may be a silicone compound that is poured into the dam then cured, or it may be a preformed element, such as a silicone sheet or a ceramic that is contained within the ring. Commonly, the encapsulant includes a wavelength conversion material that converts the light emitted by the light emitting elements to one or more other wavelength.

SUMMARY OF THE INVENTION

It would be advantageous to provide a hybrid light emitting module in a chip-on-board architecture that is more efficient than conventional chip-on-board modules.

To better address one or more of these concerns, in an embodiment of this invention, different wavelength conversion materials, or different concentrations of a wavelength conversion material may be used to encapsulate the light emitting elements of different colors. In an embodiment of this invention, the light emitting elements of a particular color are encapsulated with a transparent encapsulant, while the light emitting elements of a different color are encapsulated with a wavelength conversion encapsulant. In another embodiment of this invention, a particular set of light emitting elements of different colors is encapsulated with a different encapsulant than another set of light emitting elements.

The applicants have recognized that although each phosphor may efficiently absorb light of a first range of wavelengths and emit light of a desired second range of wavelengths, the phosphor may also absorb light of other wavelengths and not emit light at all, or emit a minimal amount of light at a third, perhaps undesired, range of wavelengths, resulting in a loss of the absorbed light, and a corresponding loss of light output efficiency.

Accordingly, in embodiments of this invention, the light emitting elements of different colors are paired with encapsulants that efficiently produce a desired light output with minimal efficiency-reducing absorptions. The light emitting elements of light of a particular wavelength that is not intended to be converted by the wavelength conversion material, for example, may be encapsulated with a phosphor-free encapsulant, while light emitting elements of light that is intended to be converted may be encapsulated with a phosphor, or phosphor mix, that efficiently converts some or all of the light to a desired wavelength or set of wavelengths.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
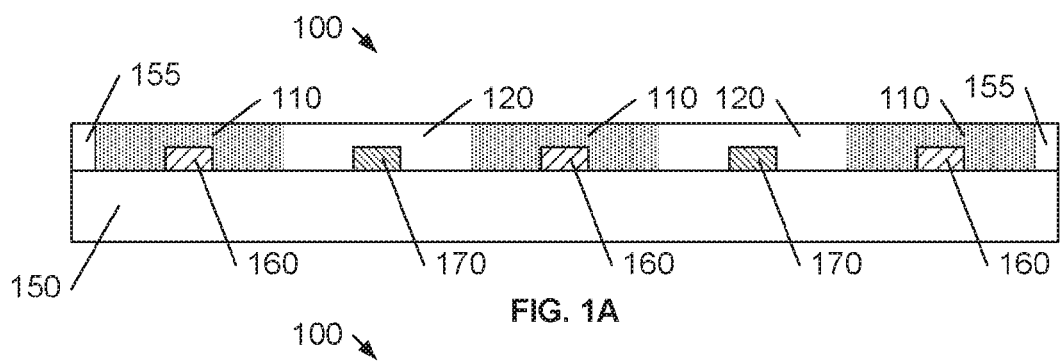
FIGS. 1A-1B illustrate an example light emitting module that includes different encapsulant material situated over sets of light emitting elements of different colors.
Figure 1B:
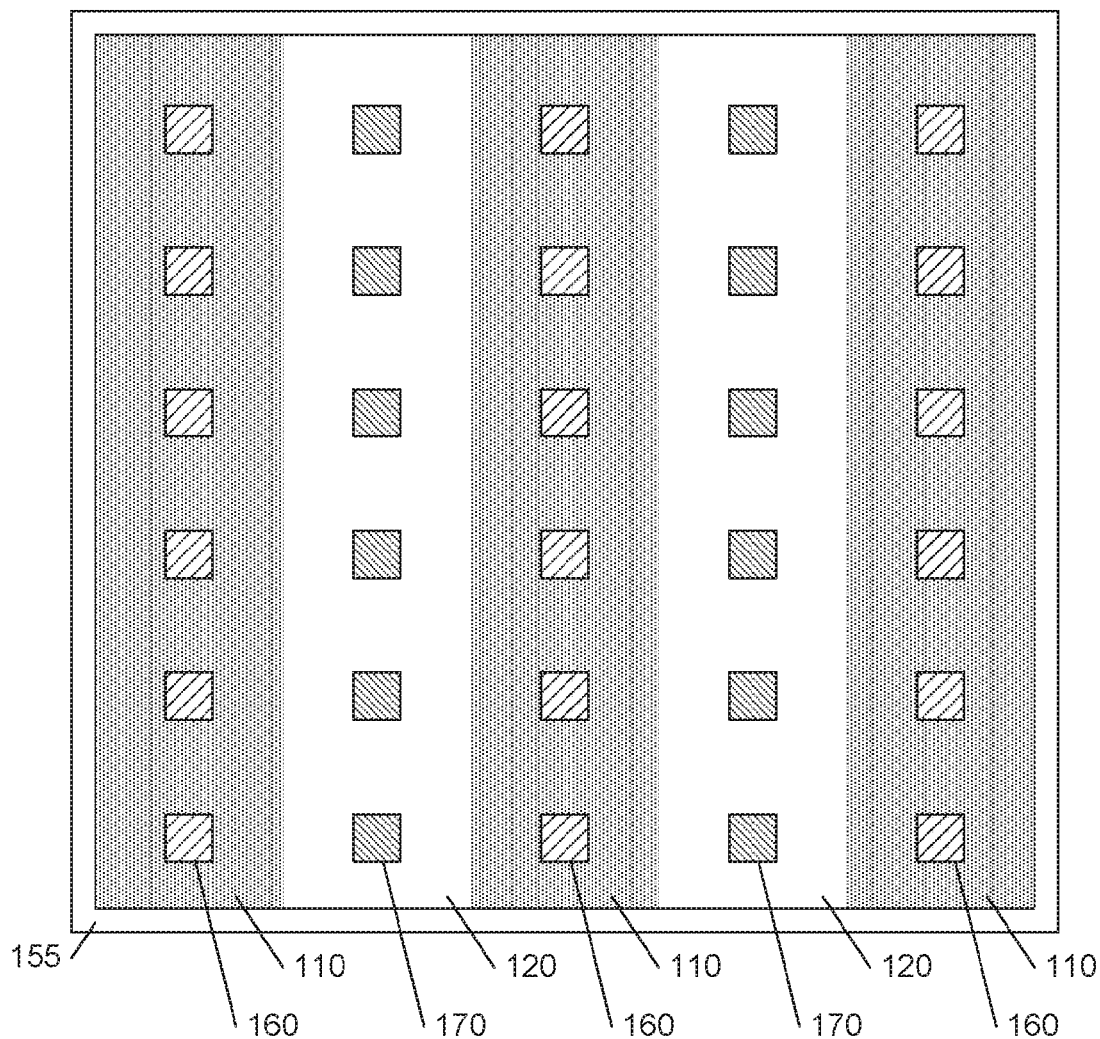

FIG. 1A illustrates a profile view and FIG. 1B illustrates a top view of an example light emitting module 100 that includes different encapsulant material situated over sets of light emitting elements of different colors. For ease of reference and understanding, the terms 'encapsulant' and 'encapsulate' are used herein in a general sense to include a material that covers the light emitting surface of the light emitting elements, to receive substantially all of the light emitted from the light emitting surface or light emitting surfaces.

In FIGS. 1A-1B, light emitting elements 160 emit a different color light than the light emitting elements 170. The light emitting elements 160, 170 are illustrated as being situated on a substrate, or board 150 that includes conductive elements (not illustrated) that serve to provide external power to the light emitting elements 160, 170. The light emitting elements 160, 170 may be discrete light emitting devices that are soldered to the conductive elements ('chip-on-board'), or may be elements that are situated on an intermediate substrate that is coupled to the conductive elements on the board 150. One of skill in the art will recognize that other configurations of light emitting elements on a substrate may be used.

A first encapsulant 110 is used to cover the light emitting elements 160, and another encapsulant 120 is used to cover the light emitting elements 170, each of the encapsulants 110, 120 having different wavelength conversion attributes. Optionally, walls 155 on the board 150 facilitate handling of the module 100, and may serve to contain the encapsulants 110, 120.

The bands of encapsulant 110, 120 may be formed by situating a thin barrier between each of the bands, then filing the regions between the barriers with the appropriate encapsulant 110, 120, typically in a semi-liquid form, such as a silicone compound, then hardening the encapsulant. The barriers may be removed as the encapsulant cures, or left within the module 100. If left within, the barriers may be transparent or reflective, depending upon the desired light output pattern.

In an alternative embodiment, a pre-formed sheet may be provided that contains the bands of encapsulants 110, 120. The pre-formed sheet may be a partially cured silicone sheet patterned with the encapsulants 110, 120 using the aforementioned barriers. The partially cured silicone sheet is placed atop the light emitting elements 160, 170, then laminated to the board 150, as detailed in U.S. Pat. No. 7,344,952, "Laminating Encapsulant Film Containing Phosphor Over LEDs", issued 3 Jul. 2008 to Haryanto Chandra, and incorporated by reference herein. In the alternative, preformed sheets of encapsulant 110 be laminated over light emitting elements 160 and preformed sheets or liquids 120 may be used to cover light emitting elements 170 after the first lamination. In another alternative, the operations and materials may be reversed.

In an example embodiment, the light emitting elements 160 emit blue light, and the light emitting elements 170 emit red light. In such an embodiment, some of the blue light is intended to be converted to yellow/green light, whereas the red light is intended to be emitted directly. Accordingly, in this example embodiment, the encapsulant 110 may include phosphors that convert blue light to yellow/green light, and the encapsulant 120 may be phosphor-free.

In other embodiments, the light emitting elements 160 provide light of a first wavelength, light emitting elements 170 provide light of a second wavelength, and encapsulants 110, 120 provide corresponding light of third and fourth wavelengths.

Although light emitting elements of only two different colors are illustrated in this example, one of skill in the art will recognize that light emitting elements of a variety of different colors/wavelengths may be included in the light emitting module, with a variety of different encapsulants.

Likewise, patterns that are not banded, such as checkerboard patterns or unequal distribution of different types of light emitting elements and corresponding encapsulants, are contemplated and are included within the scope of the invention. In another alternative three or more pairs of light emitting elements/encapsulants are contemplated and are included within the scope of the invention.

Figure 2:
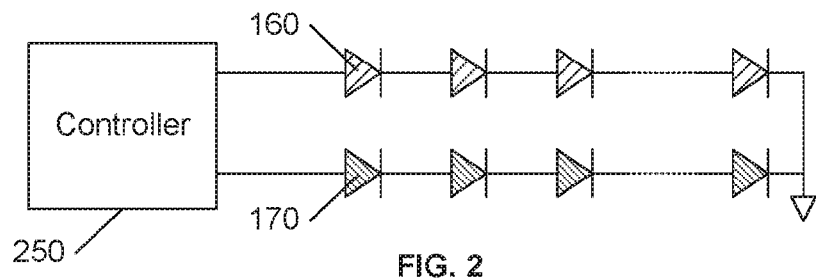
FIG. 2 illustrates an example controller for adjusting the relative intensity of the light output from each set of light emitting elements.

FIG. 2 illustrates an example controller for adjusting the relative intensity of the light output from each set of light emitting elements. A controller 250 is provided with a source of power, and distributes this power to the sets of light emitting elements 160, 170 so as to provide a desired ratio of light output between the two sets. Although a series arrangement is illustrated for each set of light emitting elements 160, 170, one of skill in the art will recognize that alternative arrangements, such as parallel and series-parallel, may be used to configure each set. In the alternative three or more types of light emitting elements are contemplated and are included within the scope of the invention.

In an example embodiment, the controller 250 may include controls that enable a user to adjust the overall light output intensity as well as the ratio of light output provided by the combination of light emitting elements 160 and encapsulant 110 and the combination of light emitting elements 170 and encapsulant 120.

Although the encapsulants 110, 120 are illustrated in FIGS. 1A-1B with uniform profile and clearly defined boundaries/edges, one of skill in the art will recognize that alternative configurations may be used, and that different combinations may be used to distribute light in the center different from light at the edges. For example, the spacing between and among the light emitting elements may vary to achieve a desired light output distribution, to accommodate light emitting elements having different light output intensities, and so on.

One of skill in the art will also recognize that the different encapsulants 110, 120, may exhibit different light output patterns, due, for example, to different light scattering properties of the encapsulants 110, 120, or other optical effects. If desired, scattering agents or other materials may be added to one or both of the encapsulants 110, 120 to produce a desired combination of effects, such as providing for similar scattering effects from each of the encapsulants 110, 120. In like manner, as detailed further below, the geometric shape of the encapsulants 110, 120 may differ to achieve a desired effect.

Figure 3:
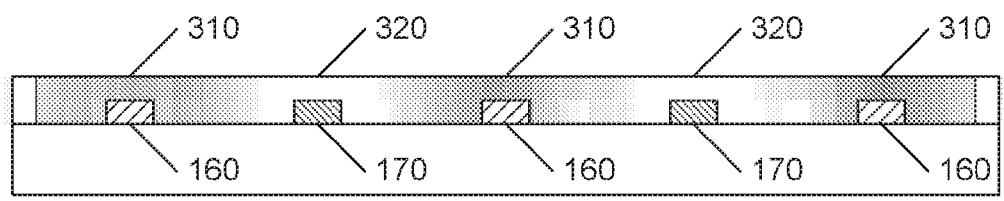
FIG. 3 illustrates an example of another light emitting module that includes different encapsulant material situated over sets of light emitting elements of different colors.

FIG. 3 illustrates an example of another light emitting module that includes different encapsulant material situated over sets of light emitting elements of different colors. In this embodiment, the concentration of wavelength conversion elements (e.g. phosphors) within the encapsulant is varied such that a larger concentration 310 of phosphor is situated above the light emitting elements 160 and a substantially smaller concentration 320 of phosphor is situated above the light emitting elements 170.

The varying phosphor concentrations may be provided, for example, by applying a semi-liquid material, such as silicone, over the light emitting elements, then applying the phosphor material in selected regions, using, for example, screen printing or other patterning techniques. Alternatively, a multi-nozzle dispenser may dispense rows of different encapsulants in semi-liquid form over the rows of light emitting elements, allowing for the fact that some blending of the different encapsulants may occur at the interface between each row.

Figure 4:
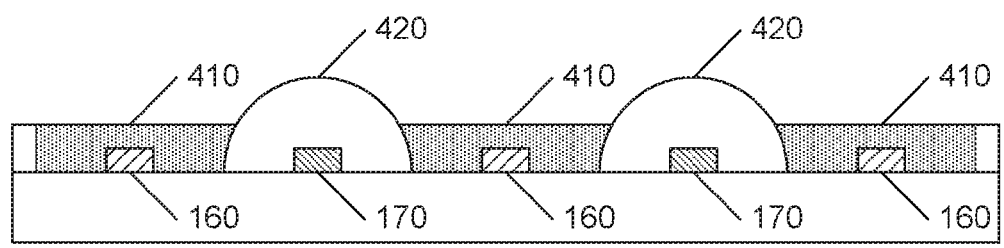
FIG. 4 illustrates an example of a light emitting module that includes differently shaped encapsulant material situated over sets of light emitting elements of different colors.

FIG. 4 illustrates an example of a light emitting module that includes differently shaped encapsulant material situated over sets of light emitting elements of different colors.

In the example embodiment of FIG. 4, the light emitting elements 170 are initially encapsulated in a hemispherical shape encapsulant 420, using, for example, silicone that is molded upon the light emitting elements 170. The hemispherical shape of the encapsulant 420 increases the range of the light output pattern from the encapsulant 420, particularly if the encapsulant 420 does not contain a phosphor and the light emitting elements 170 emit directly without wavelength conversion.

Subsequent to the creation of the shaped encapsulant 420, a second encapsulant 410, such as a phosphor-containing silicone, may be applied to fill the regions between the domes 420.

One of skill in the art will recognize that the particular sequence of creating the encapsulants 410, 420 may be reversed, and the particular profile shape of the each encapsulant may vary, depending upon the desired light output pattern.

Although this invention has been presented using the paradigm of a two-color hybrid module, with each color being exclusively encapsulated by the same encapsulant, one of skill in the art will recognize that different encapsulants may be applied to different mixtures, or sets of colors.

Figure 5:
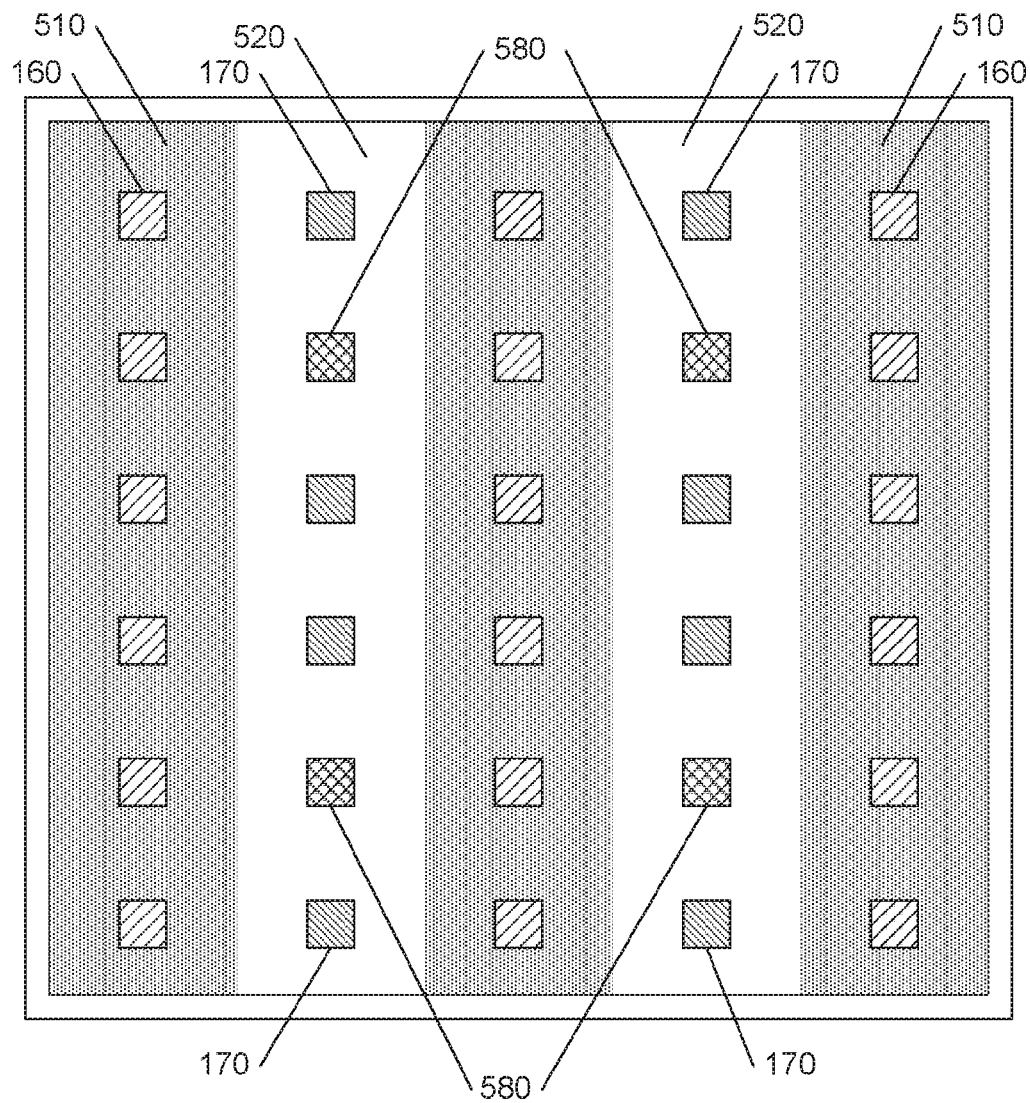
FIG. 5 illustrates an example of a light emitting module that includes different encapsulant material situated over different sets of light emitting elements.

FIG. 5 illustrates an example of a light emitting module that includes different encapsulant material situated over different sets of light emitting elements.

As noted above, conventionally, the ratio of emitted light to converted light is controlled by the concentration of wavelength conversion elements in the wavelength conversion material. In an embodiment of this invention, the ratio of light of a first color to light of a converted color may also be controlled by providing a different encapsulant for a portion of the light emitting elements that emit the first color.

In the example of FIG. 5, some light emitting elements 580 are included within the set of light emitting elements 170 that are encapsulated in the encapsulant 520. These light emitting elements 580 may emit light at the same wavelength as the light emitting elements 160, or light of a different wavelength than either light emitting elements 160 or light emitting elements 170.

In an embodiment where the light emitting elements 580 are light emitting elements 160, the combination of light emitting elements 580 (also called 160) within the encapsulant 520 and the combination of light emitting elements 160 within the encapsulant 510 provide different light outputs.

The light emitting elements 580 that are within the encapsulant 520 with the light emitting elements 170 may be commonly controlled with the light emitting elements 170, or separately controlled. For example, if the light emitting elements 170 are red-emitting and the light emitting elements 580 are blue-emitting elements 160, and the encapsulant 510 is blue-to-yellow/green converting and the encapsulant 520 is transparent, a separate control of the light emitting elements 580 (160) beneath the transparent encapsulant 520 will provide for an a measure of independent control of the blue content in the composite light output. Alternatively, a common control of the light emitting elements 580 (160), 170 beneath the transparent encapsulant will provide for control of the ratio of red-blue light to blue/yellow/green light.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment wherein all of the light emitting elements of a particular color are commonly controlled, independent of the encapsulant covering the light emitting element. In an alternative each light emitting element may be separately controlled.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A lighting module comprising:
   a first plurality of light emitting elements configured to emit a first light;
   a second plurality of light emitting elements configured to emit a second light;
   a substrate upon which the first plurality of light emitting elements and second plurality of light emitting elements are arranged;
   an encapsulation layer formed of an encapsulation material uniformly disposed over the first plurality of light emitting elements, the second plurality of light emitting elements, and an area over the substrate between the first pluarlity of light emitting elements and the second plurality of light emitting elements; and
   a wavelength converting element dispersed and infused within the encapsulation material in the encapsulation layer, wherein a concentration of the wavelength converting element in the encapsulation layer varies, is larger over the first plurality of light emitting elements, and is smaller over the second plurality of light emitting elements, and in the area over the substrate and between the first plurality of light emitting elements and the second plurality of light emitting elements is less than the concentration over the first plurality of light emitting elements and is more than the concentration over the second plurality of light emitting elements.

2. The lighting module of claim 1, wherein the concentration of the wavelength converting element in the encapsulation layer in the area of the encapsulation layer over the substrate and between the first plurality of light emitting elements and second plurality of light emitting elements is a gradient decreasing toward the plurality of second light emitting elements.

3. The lighting module of claim 1, further comprising a third pluarlity of light emitting elements, the first plurality of light emitting elements arranged in a first row, the second plurality of light emitting elements arranged in a second row aligned in a same direction as the first row, and the third plurality of light emitting elements arranged in a third row aligned in the same direction as the first row and on an opposite side of the second plurality of light emitting elements from the first row, the concentration of wavelength converting element in the encapsulation layer decreases as a distance from the first row toward the second row increases, and the concentration of wavelength converting element in the encapsulation layer increases as a distance from the second row toward the third row increases.

4. The lighting module of claim 1, wherein the concentration of the wavelength converting element in the encapsulation layer over the second plurality of light emitting elements is substantially zero.

5. The lighting module of claim 1, wherein a concentration of wavelength converting element is arranged to convert a portion of the first light to a fourth light having a longer wavelength than the first light, leave a remaining portion of the first light unconverted, and substantially all of the second light unconverted.

6. The lighting module of claim 5, wherein the first light is blue light and the second light is red light.

7. The lighting module of claim 6, wherein the wavelength converting element converts blue light to yellow/green light, and the concentration of wavelength converting element over the first plurality of light emitting elements is set to convert only a portion of the blue light to yellow/green light, and a resulting light output by the lighting module includes a mixture of unconverted blue light, unconverted red light, and yellow/green light.

8. The lighting module of claim 1, further comprising a third plurality of light emitting elements configured to emit a third light.

9. The lighting module of claim 8, wherein the third light is a same color as the first light.

10. The lighting module of claim 8, further comprising a controller electrically connected to provide a first power to the first plurality of light emitting elements and separately electrically connected to provide a second power to the second plurality of light emitting elements and third plurality of light emitting elements.

11. The lighting module of claim 1, wherein the first plurality of light emitting elements and second plurality of light emitting elements are arranged on the substrate in alternating rows.

12. A method for producing a lighting module comprising:
    situating a first plurality of light emitting elements configured to emit a first light having a first wavelength range and a second plurality of light emitting elements configured to emit a second light having a second wavelength range different from the first wavelength range on a substrate;
    applying a semi-liquid material over the first plurality of light emitting elements and second plurality of light emitting elements using a multi-nozzle dispenser containing multiple nozzles, wherein a first nozzle of the multi-nozzle dispenser dispenses semi-liquid material containing a first concentration of a phosphor material over a corresponding first plurality of light emitting elements, and a second nozzle of the multi-nozzle dispenser adjacent to the first nozzle dispenses semi-liquid material containing a second concentration of a phosphor material different from the first concentration over a second plurality of light emitting elements;
    allowing the semi-liquid material dispensed from adjacent nozzles to blend; and
    hardening the semi-liquid material.

13. The method of claim 12, wherein a concentration of the phosphor material in a portion of the nozzles of the multi-nozzle dispenser is substantially zero.

14. The method of claim 12, further comprising situating a third plurality of light emitting elements configured to emit a third light on the substrate in a same row as the plurality of second light emitting elements, wherein applying a semi-liquid material over the first plurality of light emitting elements and second plurality of light emitting elements using a multi-nozzle dispenser includes applying the semi-liquid material over the third plurality of light emitting elements using the multi-nozzle dispenser.

15. The method of claim 14, wherein the third light is a same color as the first light.

* * * * *